(12) United States Patent
Fujikawa

(10) Patent No.: US 8,471,257 B2
(45) Date of Patent: Jun. 25, 2013

(54) MOTHERBOARD, PRODUCTION METHOD OF MOTHERBOARD, AND DEVICE SUBSTRATE

(75) Inventor: Yohsuke Fujikawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 310 days.

(21) Appl. No.: 13/058,279

(22) PCT Filed: Jun. 9, 2009

(86) PCT No.: PCT/JP2009/060549
§ 371 (c)(1),
(2), (4) Date: Feb. 9, 2011

(87) PCT Pub. No.: WO2010/032519
PCT Pub. Date: Mar. 25, 2010

(65) Prior Publication Data
US 2011/0140110 A1      Jun. 16, 2011

(30) Foreign Application Priority Data
Sep. 18, 2008   (JP) .................................. 2008-239167

(51) Int. Cl.
*H01L 33/00* (2010.01)
*H01L 21/20* (2006.01)

(52) U.S. Cl.
USPC  257/59; 257/72; 257/E33.003; 257/E33.004; 257/E21.09; 438/488; 438/482

(58) Field of Classification Search
USPC ......... 257/59, 72, E33.003, E33.004, E21.09; 438/488, 482
See application file for complete search history.

(56) References Cited

U.S. PATENT DOCUMENTS
2008/0050893 A1   2/2008   Shimmoto et al.

FOREIGN PATENT DOCUMENTS

| JP | 63-11989 | 1/1988 |
| JP | 2-021612 | 1/1990 |
| JP | 11-186163 | 7/1999 |
| JP | 2000-12460 | 1/2000 |
| JP | 2001-44133 | 2/2001 |
| JP | 2001-044133 | * 2/2001 |
| JP | 2001-53282 | 2/2001 |
| JP | 2003-271067 | 9/2003 |
| JP | 2005-276996 | 10/2005 |
| JP | 2008-053394 | 3/2008 |

OTHER PUBLICATIONS

International Search Report for PCT/JP2009/060549, mailed Aug. 11, 2009.

* cited by examiner

*Primary Examiner* — Victor A Mandala
(74) *Attorney, Agent, or Firm* — Nixon & Vanderhye, P.C.

(57) ABSTRACT

The present invention provides a motherboard having panel substrates efficiently arranged thereon and a reduced wasted substrate region, a method for producing the motherboard, and a device substrate comprising the panel substrates formed on the motherboard. The motherboard of the present invention comprises a plurality of panel substrates, wherein the motherboard has a silicon thin film formed on a principal surface thereof, each of the panel substrates has a transistor forming region and a marginal region, the transistor forming region is formed by polycrystallizing the silicon thin film, the marginal region is provided on an outer edge of each of the panel substrates, and at least one of the panel substrates has the marginal region including a region with a silicon thin film which has a crystal profile different from a crystal profile of a silicon thin film in the transistor forming region.

18 Claims, 6 Drawing Sheets

MOTHERBOARD, PRODUCTION METHOD OF MOTHERBOARD, AND DEVICE SUBSTRATE

This application is the U.S. national phase of International Application No. PCT/JP2009/060549, filed 9 Jun. 2009, which designated the U.S. and claims priority to Japanese Patent Application No. 2008-239167, filed 18 Sep. 2008, the entire contents of each of which are hereby incorporated by reference.

TECHNICAL FIELD

The present invention relates to a motherboard, a production method of the motherboard, and a device substrate. More specifically, the present invention relates to a motherboard comprising a plurality of panel substrates, a production method of the motherboard, and a device substrate comprising a panel substrate formed on the motherboard.

BACKGROUND ART

Now, display cells used in flat panel displays, flat panel detectors, and the like are commonly produced by cutting out a plurality of display cells at once from a motherboard that is a large substrate. For example, liquid crystal cells which are typical display cells used in flat panel displays are produced as follows. A motherboard (hereinafter, also referred to as first motherboard) on which a plurality of panel substrates to be used as device substrates are arranged and a motherboard (hereinafter, also referred to as second motherboard) on which a plurality of panel substrates to be used as color filter (CF) substrates are arranged are bonded to each other by using a sealing material in a manner such that panel substrates on respective motherboards face to one another. Each panel substrate is cut out from the bonded motherboard to produce a plurality of cells. A liquid crystal is injected into the obtained cells by a method such as vacuum injection.

In the liquid crystal cell obtained by the above method, a device substrate is often equipped with a monolithic circuit including a thin film transistor that is made of a polycrystalline silicon thin film, in response to a recent demand for miniaturization of the frame region of a liquid crystal cell. Such a device substrate is formed as follows, for example.

First, an amorphous silicon thin film is formed on the principal surface of the first motherboard. Subsequently, this silicon thin film is polycrystallized by laser-annealing. And the obtained polycrystalline silicon thin film is patterned into a desired shape, and other required materials are also processed. Thereby, a plurality of panel substrates each equipped with a monolithic circuit including a thin film transistor are formed on the principal surface of the first motherboard.

In the process of laser-annealing, an excimer laser which can linearly irradiate a predetermined range is used, for example. In this process, it is ideal that the range irradiated with a laser light at once (the size of a laser light from one end to the other end, hereinafter, referred to as laser length) is larger than the width of the first motherboard. However, the excimer laser has the upper limit in the laser length because of the mechanism of the device and cost limitations. At present, the maximum laser length commonly used in a comparatively inexpensive device is about 300 mm.

On the other hand, the size of the first motherboard tends to increase from year to year. For example, a glass substrate having a size of about 730 mm×920 mm is already commercially available as the first motherboard. Enlargement of the excimer laser device is behind the enlargement of the first motherboard, and the width of the first motherboard is sometimes larger than the laser length.

Here, in the case of a first motherboard on which panel substrates are arranged in a matrix pattern, for example, excimer laser and the first motherboard are relatively moved along a direction of a line or a column in accordance with the arrangement of the panel substrates, and the excimer laser scans a predetermined part or the entire principal surface of the first motherboard for a plurality of times. Thereby, only the desired part or the entire surface of a silicon thin film is polycrystallized.

However, the procedure for forming a large number of panel substrates on the first motherboard is problematically complicated and time consuming in the method (for example, see Patent Document 1) of carrying out laser-annealing only on the required part of the silicon thin film.

Moreover, the method of carrying out laser-annealing on the entire surface of a motherboard is problematically time consuming because laser irradiation is performed also on the region which does not need to be polycrystallized.

Furthermore, the principal surface of a motherboard is scanned by a laser for a plurality of times in both methods. Therefore, when assuming that the region first irradiated by the excimer laser from one end to the other end of the motherboard is a first laser irradiation region and the region where the following laser irradiation is performed is a second laser irradiation region, there is a region called a laser joint region between the first laser irradiation region and the second laser irradiation region. The laser joint region is a region irradiated duplicately with a laser or not at all irradiated with a laser to keep an amorphous silicon thin film as it is.

The crystallization of the silicon thin film in the laser joint region is hardly controlled as it is intended to be. In addition, the crystallization degrees of the laser joint region, such as the average crystal grain size, the crystal grain size distribution, and the surface roughness of crystals, are significantly different from those of the first and second laser irradiation regions. Accordingly, a thin film transistor having high mobility is not appropriately formed in the laser joint region. Thus, since the laser joint region is not suitable for formation of a panel substrate, the number of the panel substrates which can be arranged on a motherboard is limited when the width of the laser joint region is large. This results in a larger useless region (hereinafter, referred to as wasted substrate region) including the laser joint region.

Moreover, as mentioned above, since the excimer laser has the upper limit in the laser length, the laser length may be slightly short depending on the size of a panel substrate. This may cause a case where the number of lines (columns) of the panel substrates which can be annealed by one laser irradiation on a motherboard is decreased. In the above example, the number of the panel substrates in each of the first and second laser irradiation regions is limited. Therefore, the number of the panel substrates which can be arranged on the whole motherboard is reduced, resulting in a problem of the additional production cost.

To solve the above problem, methods for irradiating a broader range with a laser light are disclosed, in which light from the light source is dispersed with use of a mirror and the like (for example, see Patent Documents 2 and 3). However, these methods require improvement of a laser irradiation device. In addition, a wasted substrate region mentioned above is still present between the first and second irradiation regions of laser beams which have been dispersed. Accordingly, efficient use of the motherboard can be still improved by reducing the wasted substrate region.

[Patent Document 1]
JP-A Sho-63-11989
[Patent Document 2]
JP-A Hei-11-186163
[Patent Document 3]
JP-A 2000-12460

DISCLOSURE OF INVENTION

The present invention has been devised in view of the above-mentioned state of the art, and an object thereof is to provide a motherboard having panel substrates efficiently arranged thereon and a reduced wasted substrate region, a method for producing the motherboard, and a device substrate comprising the panel substrates formed on the motherboard.

The present inventors made various investigations on a motherboard equipped with a plurality of panel substrates, and a production method thereof. As a result, the present inventors found out that the above problems can be solved by the following configuration. Namely, at least in one panel substrate, a marginal region has a region that comprises a silicon thin film having a crystal profile different from the crystal profile of the silicon thin film forming a transistor forming region. This configuration allows efficient arrangement of panel substrates on a motherboard and reduction in the wasted substrate region of the motherboard. Accordingly, the present invention has been completed. Moreover, the present inventors found out that the following laser-annealing allows efficient arrangement of panel substrates on a motherboard and reduction in the wasted substrate region to solve the above problems. Namely, the laser-annealing step is carried out as follows: a transistor forming region is formed by polycrystallizing a silicon thin film in a predetermined region by relatively moving a laser light and the motherboard; and a region including a silicon thin film is formed in at least one marginal region of the panel substrate, the silicon thin film having the crystal profile different from the crystal profile of the silicon thin film forming the transistor forming region. In this manner, the present invention has been completed. Furthermore, a device substrate comprising the panel substrates formed on the above motherboard has a region including a silicon thin film in the marginal region. The silicon thin film has a crystal profile different from the crystal profile of the silicon thin film that forms a transistor forming region. Accordingly, the present invention has been completed.

Namely, the present invention is a motherboard comprising a plurality of panel substrates, wherein the motherboard has a silicon thin film formed on a principal surface thereof, each of the panel substrates has a transistor forming region and a marginal region, the transistor forming region is formed by polycrystallizing the silicon thin film, the marginal region is provided on an outer edge of each of the panel substrates, and at least one of the panel substrates has the marginal region including a region with a silicon thin film which has a crystal profile different from a crystal profile of a silicon thin film in the transistor forming region. This arrows efficient arrangement of panel substrates on a motherboard and decrease in a wasted substrate region, and therefore, the cost can be reduced.

Further, the present invention is a production method of a motherboard comprising a plurality of panel substrates each having a transistor forming region and a marginal region, the method comprising the steps of: depositing a silicon thin film on a principal surface of a motherboard; and laser-annealing the silicon thin film for each predetermined region, wherein the step of laser-annealing is carried out so as to form a transistor forming region by moving a laser and the motherboard relatively to polycrystallize the silicon thin film in a predetermined region, and to form a region with a silicon thin film in at least one marginal region, the silicon thin film having a crystal profile different from a crystal profile of a silicon thin film that forms the transistor forming region. This production method arrows efficient arrangement of panel substrates on a motherboard and decrease in a wasted substrate region, and therefore, the cost can be reduced.

Moreover, the present invention is a device substrate comprising a transistor forming region and a marginal region, wherein the transistor forming region is formed by polycrystallizing a silicon thin film, the marginal region is provided on an outer edge of the device substrate, and the marginal region includes a region with a silicon thin film which has a crystal profile different from a crystal profile of the silicon thin film forming the transistor forming region. This device substrate comprises a panel substrate on the motherboard of the present invention.

In the motherboard, the panel substrates may be arranged in a matrix pattern so that the marginal regions orient in the same direction, and include a first panel substrate and a second panel substrate, the first panel substrate having the marginal region with a silicon thin film which has a first crystal profile, and the second panel substrate having the marginal region with a silicon thin film which has a second crystal profile that is different from the first crystal profile.

The crystal profile of the silicon thin film in the transistor forming region may be the same as the first crystal profile.

The transistor forming region may include a monolithic circuit comprising the silicon thin film.

The silicon thin film may form a manufacturing process control mark and/or an evaluation pattern in the marginal region. The manufacturing process control mark and/or the evaluation pattern may include a manufacturing process control mark and/or an evaluation pattern which include the silicon thin film having the first crystal profile and a manufacturing process control mark and/or an evaluation pattern which include the silicon thin film having the second crystal profile.

The crystal profile of the silicon thin film in the transistor forming region and the crystal profile of the silicon thin film in the marginal region may be different in at least one property selected from average crystal grain size, crystal grain size distribution, and surface roughness of crystals.

The first crystal profile and the second crystal profile may be different in at least one property selected from average crystal grain size, crystal grain size distribution, and surface roughness of crystals. The first crystal profile may be polycrystalline, and the second crystal profile may be unstable-crystalline and/or amorphous.

Each of the panel substrates may have a transistor forming region including a rectangular display region, and a marginal region formed on one side of the outer edge of the panel substrate.

In the production method of a motherboard, the step of laser-annealing may include relatively moving the motherboard and the laser along a direction of a line or a column so that the panel substrates are arranged in a matrix pattern on the principal surface of the motherboard, and laser-annealing the panel substrates so that the panel substrates include a first panel substrate having a marginal region with a silicon thin film that has a first crystal profile and a second panel substrate having a marginal region with a silicon thin film that has a second crystal profile different from the first crystal profile.

Here, the step of laser-annealing may be carried out so that the crystal profile of the silicon thin film in the transistor forming region is the same as the first crystal profile.

The production method of a motherboard may further comprise the step of patterning the silicon thin film in the marginal region to form a manufacturing process control mark and/or an evaluation pattern. The silicon thin film to be patterned may be an unstably-crystallized silicon thin film and/or an amorphous silicon thin film.

In the production method of a motherboard, the laser may be excimer laser.

In the device substrate, an unstable-crystallized silicon thin film or an amorphous silicon thin film may form a manufacturing process control mark and/or an evaluation pattern in the marginal region.

In the present invention, a marginal region refers to a region provided in the end portion of a panel substrate and includes a region in which a monolithic circuit is not present. For example, a terminal region for forming a connection terminal therein is included. Commonly, a marginal region is also called a frame region.

The present invention is explained in more detail below.

The motherboard of the present invention comprises a plurality of panel substrates. A motherboard is a large substrate from which, for example, a device substrate and a CF substrate which constitute a liquid crystal cell and the like are cutout. A glass substrate is commonly used as a motherboard. In the following, a motherboard for forming a device substrate of a liquid crystal cell, namely, the first motherboard mentioned above is explained as an example of the motherboard. In the present invention, a panel substrate refers to a plurality of substrates arranged on a motherboard, and a device substrate refers to what is separated from the motherboard by detaching, cutting, and the like.

FIG. 1 is a perspective view illustrating the configuration of a liquid crystal cell using a device substrate obtainable in the present invention, and FIG. 2 is a plan view of the liquid crystal cell illustrated in FIG. 1. Here, a liquid crystal cell having three-side-free structure is described in which a device substrate and a CF substrate are different in size and the terminal region as a marginal region is provided only on one side of the outer edge of the device substrate. Since the liquid crystal cell having the three-side-free structure can decrease the number of external circuit components, it is favorable to reduce the size of the liquid crystal cell and is also advantageous in respect of the connection reliability and cost.

A liquid crystal cell 100 includes a device substrate (TFT side substrate) 110 in which various circuits are formed, and a CF substrate 120 including a CF layer, in FIGS. 1 and 2. Both substrates are arranged so that the film surfaces face to each other, and fixed by interposing a sealing material 130 in a manner such that a predetermined gap is held therebetween. The sealing material 130 is formed along four sides of the liquid crystal cell 100 at a predetermined distance from the end portion of the liquid crystal cell 100 and in a linewidth of about 1 mm. The liquid crystal (not illustrated) is interposed in the space surrounded by the sealing material 130 between these substrates. A liquid crystal is, for example, injected by vacuum injection, and is enclosed with a sealing resin 140. The liquid crystal cell 100 in which a liquid crystal has been injected by vacuum injection has a partial chip in the sealing material 130 and includes the liquid crystal enclosed with the sealing resin 140. In recent years, an instillation method is also practically used in which the sealing material 130 does not have a chip.

The device substrate 110 includes a transistor forming region 111 and a terminal region 112. The transistor forming region 111 has a thin film transistor which includes an active layer made of a polycrystallized silicon thin film. Since having a favorable device characteristic, the thin film transistor can form not only a pixel array constituting a display region 113 which performs an image display, but also various monolithic circuits. Examples of the monolithic circuits include a gate driver circuit 114 and a source driver circuit 115. In addition to these circuits, another circuit 116 such as a power supply circuit can be formed. The device substrate 110 including a monolithic circuit is combined with the three-side-free structure so as to produce a more compact and light liquid crystal cell (display cell).

The terminal region 112 is a region for forming a connection terminal (hereinafter, referred to as terminal) 117 therein. The terminal 117 is for connecting the monolithic circuit and an external drive circuit (not illustrated) which supplies a driving power source to the monolithic circuit, through a wiring 118. The terminal region 112 is formed on one side of the outer edge of the device substrate 110 that is larger than the CF substrate 120, in FIGS. 1 and 2. In the terminal region 112, a manufacturing process control mark 151 and an evaluation pattern (TEG, Test Element Group) 152, in addition to the terminal 117, may be arranged. Examples of the evaluation patterns include patterns for evaluating an electrical property, the thickness of a thin film, the dimensional accuracy, an optical property, and the like.

The manufacturing process control mark 151 is formed by patterning a silicon thin film, a metal thin film and the like to indicate, for example, the kind of the liquid crystal cell and a barcode, a position check mark and the like. When assembling the liquid crystal cell to form a liquid crystal display and the like, the shape of the mark is read by a reader so that the item number and the like are checked. In FIGS. 1 and 2, the item number is indicated as the manufacturing process control mark 151.

The TEG 152 is formed by patterning a silicon thin film, a metal thin film, and the like in the terminal region 112, and for evaluating the element of the transistor forming region 111. In a case where a silicon thin film is patterned to form the TEG 152, since the TEG 152 has the same crystallization degree as the silicon thin film in the transistor forming region 111, measurement of the crystallization degree of the TEG 152 can determine whether the thin film transistor in the transistor forming region 111 is favorably polycrystallized.

Both the manufacturing process control mark 151 and the TEG 152 may be formed, or alternatively, only either of them may be formed.

The device substrate 110 constituting the above configuration is formed with use of the first motherboard, as mentioned above. FIG. 3(a) is a schematic plan view for explaining the first motherboard in the present invention, and the production method thereof. FIG. 3(b) is a schematic view of a panel substrate arranged on the first motherboard. In FIG. 3(a), a first motherboard 301 includes a silicon thin film (not illustrated) formed on the principal surface, and a plurality of panel substrates 302 arranged in a matrix pattern. The panel substrates 302 illustrated in FIG. 3(b) are for forming the device substrate 110 illustrated in FIGS. 1 and 2, and each of the panel substrates 302 includes a transistor forming region 303 for forming the transistor forming region 111 and a terminal region 304 for forming the terminal region 112.

The transistor forming region 303 is made of a polycrystallized silicon thin film, and includes monolithic circuits, such as a pixel array, a gate driver circuit, and a source driver circuit. The silicon thin film forming the transistor forming region 303 affects the display properties, and therefore, it is necessary to uniformly polycrystallize silicon thin films with regard to all the panel substrates 302.

The terminal region 304 is provided on the outer edge of the panel substrate 302. With regard to the transistor forming region 303 and the terminal region 304, various components are formed therein after the laser-annealing of silicon thin films, and they are allowed to have the same configurations as the transistor forming region 111 and the terminal region 112, at the stage before being separated from the first motherboard 301.

In the present invention, at least one of the arranged panel substrates 302 need to have a region including a silicon thin film which has a crystal profile different from that of the silicon thin film forming the transistor forming region 303 in the terminal region 304.

This is based on the following reasons.

First, the present inventors noted that the terminal region 112 of a display cell such as the liquid crystal cell commonly has no monolithic circuit formed therein, and is often occupied by a terminal 117, a manufacturing process control mark 151, and a TEG 152, as illustrated in FIGS. 1 and 2. For example, since more circuits are monolithically formed in the transistor forming region 111 in the case of a liquid crystal cell 100 housing a power supply circuit and having a sensor function, the number of signal lines to connect with the outside is increased so that the most part of the terminal region 112 is more likely to be occupied by the terminals 117.

Accordingly, the present inventors have arrived at an idea that, if a monolithic circuit is not formed in the terminal region 112 of the liquid crystal cell 100 as mentioned above, a silicon thin film in the terminal region 304 in the panel substrate 302 illustrated in FIG. 3 does not need to have the same crystallization degree in all the panel substrates 302, and does not need to be favorably polycrystallized. In short, the present inventors have arrived at an idea that there is even no necessity of annealing the silicon thin film in the terminal region 304.

Based on this idea, the present inventors have found that, in the step for producing the first motherboard 301 including the panel substrates 302, the terminal region 304 of each of the panel substrates 302 can be used as a laser joint region. Accordingly, the present inventors have found that, by arranging the panel substrates 302 on the first motherboard 301 in a manner such that the terminal region 304 of each of the panel substrates 302 is included in the conventional laser joint region, the panel substrates 302 can be efficiently arranged. As a result, the above problems can be solved.

In the following, an explanation is given on an example of the production method of the first motherboard 301 including the panel substrate 302 in the present invention.

First, a silicon thin film is deposited on the principal surface of the first motherboard 301. The deposition of a silicon thin film is performed by a conventionally known method, such as the CVD (Chemical Vapor Deposition) method and the like. The deposited silicon thin film is an amorphous silicon thin film.

Next, the deposited silicon thin film is laser-annealed for every predetermined region. In this step, as illustrated in FIG. 3(a), the laser irradiation is performed on the first motherboard 301 for a plurality of times by scanning with use of a laser 305 capable of linearly irradiating a predetermined range. Excimer laser having an excimer laser source is suitably used as the laser 305 which performs such laser irradiation. The laser-annealing may be carried out by relatively moving the laser 305 and the first motherboard 301 along a direction of a line or a column in accordance with the arrangement of the panel substrates 302. Here, a case will be described where the laser-annealing is carried out by moving the laser 305 in the direction of arrow A while the first motherboard 301 is fixed.

When assuming that the range where the laser 305 moves from one end to the other end of the first motherboard 301 is a laser irradiation region, the first motherboard 301 illustrated in FIG. 3(a) is provided with first to fourth laser irradiation regions R1 to R4. In each of the laser irradiation regions R1 to R4, 12 panel substrates 302 in two lines and six columns are included.

FIG. 3(c) is a schematic view illustrating a state of laser irradiation in the laser irradiation regions R1 to R4. In performing laser irradiation to the first laser irradiation region R1, for example, laser irradiation is performed on all the transistor forming regions 303 and the terminal regions 304 with respect to the panel substrates 302 in the first line, and laser irradiation is performed only on the transistor forming regions 303 and not on the terminal regions 304 with respect to the panel substrate 302 in the second line.

Thereby, as illustrated in FIG. 3(c), the panel substrates 302a in which the entire surface is polycrystallized and the panel substrates 302b in each of which only the transistor forming region 303 is polycrystallized are present in the first laser irradiation region R1. Namely, all the six panel substrates 302 in the first line become the panel substrates 302a in which the transistor forming regions 303a and the terminal regions 304a are polycrystallized, and the six panel substrates 302 in the second line become panel substrates 302b in which only the transistor forming regions 303b are polycrystallized and the terminal regions 304b remain amorphous.

Next, also in the second laser irradiation region R2, laser irradiation is performed in the same manner as in the first laser irradiation region R1. At this time, a laser joint region RG is formed between the first laser irradiation region R1 and the second laser irradiation region R2. Here, the terminal regions 304b of the panel substrates 302b arranged in the second line in the first laser irradiation region R1 are used as a part of the laser joint region RG.

The crystallization degree of the silicon thin film in the laser joint region RG cannot be controlled as mentioned above. In addition, the laser joint region RG is significantly different from the transistor forming regions 303 of the panel substrates 302 in the crystallization degree including the average crystal grain size, crystal grain size distribution, and surface roughness of crystals. In the present invention, the panel substrates 302 are arranged so that marginal regions (terminal regions 304b) of the panel boards 302b are included in the laser joint region RG. Here, as mentioned above, a monolithic circuit is not formed in the terminal region 304b of each of the panel substrates 302b, and only the manufacturing process control mark 151 and the TEG 152, in addition to the terminal 117, are formed in the terminal region 304b. Therefore, it is not particularly a problem that the terminal region 304b is not crystallized to the same extent as the transistor forming region 303b.

Laser irradiation is performed on the third laser irradiation region R3 and the fourth laser irradiation region R4 in the same manner as in the first and second laser irradiation regions R1 and R2. Through the above-mentioned treatment, 48 pieces of the panel substrates 302 are formed on the first motherboard 301.

As mentioned above, at least apart of the marginal regions of the panel substrates 302, more specifically, the terminal regions 304b formed between two adjacent laser irradiation regions are used as a part of the laser joint region RG. In this manner, it is possible to narrow a space D1 between two lines of the panel substrates 302 arranged over the adjacent two laser irradiation regions. This arrows efficient arrangement of the panel substrates 302 on the first motherboard 301, and in some cases, it is possible to increase the number of the panel substrates 302 which can be manufactured from one first motherboard 301 without any inconvenience in production control. In addition, the marginal region may include, for example, frame regions in each of which no monolithic circuit is present, in addition to the terminal regions 304. The monolithic circuit is formed at a position included in the terminal region 304 in the adjacent two laser irradiation regions.

Moreover, it is possible to reduce the wasted substrate region formed on the first motherboard 301 which has been separately needed by narrowing the space D1 between two lines of the panel substrates 302 arranged over the adjacent two laser irradiation regions. Furthermore, efficient arrangement of the panel substrates 302 allows formation of another circuit in the region which has conventionally been the wasted substrate region, leading to the effective use of the first motherboard 301.

In the case of using excimer laser as the laser 305, since the excimer laser has the upper limit in the laser length as mentioned above, there may have been a case where the laser length is slightly short and the number of lines (columns) of the panel substrates 302 which can be annealed by one laser irradiation on the first motherboard 301 is decreased. However, in the present invention, there may be a case where use of the marginal region of the panel substrate 302 as a part of the laser joint region RG allows the number of lines of the panel substrates 302 which can be irradiated in one laser irradiation to increase even in the case of using the excimer laser of the same laser length.

In addition, since the marginal region (terminal region 304b in the above example) does not need to be irradiated with a laser, the laser 305 having the same laser length can irradiate the panel substrate 302 of bigger size. As a result, increase in size of the panel substrate 302 is appropriately handled. However, the space between two lines of the panel substrates 302 is not completely eliminated because it is used as a region for forming a short ring (wiring which short-circuits terminals in a wasted substrate region) that is suitably used, for example, as a measure against static discharge.

In at least one panel substrate 302 on the first motherboard 301 having the above structure, as mentioned above, a marginal region (terminal region 304) is provided which has a region comprising a silicon thin film having a crystal profile different from the crystal profile of the silicon thin film forming the transistor forming region 303.

The difference in crystal profile refers to differences in, for example, the average crystal grain size, the crystal grain size distribution, the surface roughness of crystals, the growth directions of crystal grains, and the like. Or alternatively, the state where the crystal profiles are different may refer to a case where the first crystal profile is polycrystalline and the second crystal profile is amorphous. However, in a transistor forming region, polycrystalline silicon preferably has the larger average crystal grain size, the smaller crystal grain size distribution, and the smaller surface roughness of crystals compared to polycrystalline silicon in a marginal region (terminal region 304). This is for obtaining a thin film transistor having a high mobility and good pressure resistance.

In the conventional first motherboard, the crystal profiles of the silicon thin films are the same in all the panel substrates, as later described. In addition, the crystal profiles are the same between the silicon thin films in a terminal region and in a transistor forming region.

In the present invention, a plurality of the panel substrates 302 arranged on the first motherboard may include a first panel substrate having a marginal region with a silicon thin film having the first crystal profile and a second panel substrate having a marginal region with a silicon thin film having the second crystal profile that is different from the first crystal profile.

In the case illustrated in FIGS. 3(a) to 3(c), the first panel substrate refers to the panel substrate 302a arranged in the first line in each of the laser irradiation regions R1 to R4, and the second panel substrate refers to the panel substrate 302b arranged in the second line in each of the laser irradiation regions R1 to R4.

The state where the first crystal profile is different from the second crystal profile refers to a state where the average crystal grain size, the crystal grain size distribution, the surface roughness of crystals, the growth direction of a crystal grain, and the like are different, as mentioned above. Or alternatively, it may refer to the case where the first crystal profile is polycrystalline and the second crystal profile is amorphous. For example, the first crystal profile may refer to the profile obtained through one laser annealing, and the second crystal profile may refer to the profile obtained through no laser annealing, two or more laser annealing, or the like.

The crystal profile of the silicon thin film in the transistor forming region 303 may be the same as the first crystal profile. In the case illustrated in FIG. 3(c), the transistor forming regions 303a and 303b have the crystal profiles as same as that of the terminal region 304a as a marginal region.

On the first motherboard 301 to which the laser annealing has been performed, a silicon thin film polycrystallized by a conventional method is patterned and formation and processing of other required components are further carried out. Thereby, a monolithic circuit including a pixel array and a thin film transistor is formed in the transistor forming region 303.

The production method of the present invention may further include a step for forming a manufacturing process control mark and/or a TEG in the marginal region of the panel substrate 302 produced in the above processes such as the terminal region 304. The manufacturing process control mark and/or the TEG have the same configurations as the manufacturing process control mark 151 and the TEG 152 illustrated in FIGS. 1 and 2, and may be formed through patterning of the silicon thin film in the terminal region 304.

In the present invention, in the case of the marginal region of the present invention includes the terminal region 304, the silicon thin film especially in the terminal region 304b is an unstably-crystallized silicon thin film or an amorphous silicon thin film. Therefore, the manufacturing process control mark and the TEG are made of an unstably-crystallized silicon thin film or an amorphous silicon thin film. Here, "unstably-crystallized" or "unstable crystal" refers to "accidentally laser-annealed not under control", or "the crystal produced by accidental laser annealing not under control".

Here, the present inventors made the following consideration with regard to the manufacturing process control mark 151 and the TEG 152.

The manufacturing process control mark 151 indicates an item name, a barcode, a position check mark, and the like which are patterned by using a silicon thin film, a metal thin film, and the like. Since a reader only reads the shape of the mark, the material of the mark does not have any influence on that function. Therefore, even if the mark is patterned by using any of a nonuniform polycrystalline silicon thin film, an amorphous silicon thin film, and a uniform polycrystalline silicon thin film, the mark does not have any functional inconvenience as long as the shape is not changed.

On the other hand, the TEG 152 can be used to determine whether the thin film transistor is favorably polycrystallized. For example, in the above example, the TEG 152 in the terminal region 304a and the TEG 152 in the terminal region 304b are seemed to be properly formed. However, the TEG 152 in the terminal region 304b cannot determine whether the transistor is favorably formed because the TEG 152 has a crystal profile different from that of the silicon thin film in the transistor forming region 303b, while the TEG 152 in the terminal region 304a is favorably polycrystallized as it has the same crystal profile as the silicon thin film in the transistor forming region 303a. Therefore, in such a case, evaluation and management of a device can be achieved by evaluating the TEG 152 in the terminal region 304a.

In addition, in each of the terminal regions 304 (304a, 304b), either the manufacturing process control mark 151 or the TEG 152 may be formed, or alternatively, both of them may be formed. Moreover, the manufacturing process control mark 151 and the TEG 152 may be formed in the frame region, as a marginal region, where a monolithic circuit is not present.

As mentioned above, in order to use the marginal region (terminal region 304b) of the panel substrate 302b as the laser joint region RG, the panel substrates 302 are preferably arranged in a matrix pattern so that the marginal regions (terminal regions 304) orient in the same direction on the first motherboard 301. Such arrangement of the panel substrates 304 allows easy polycrystallization of the silicon thin film so that the crystal profiles of the transistor forming region 303 and the terminal region 304 are different.

The first motherboard 301 equipped with the panel substrates 302 formed as mentioned above and the motherboard (not illustrated) on which as many CF substrates as the panel substrates 302 are formed are bonded with a sealing material so that the panel substrates 302 and the CF substrates may face to one another. Then, the bonded motherboard is cut so that a desired cell may be obtained. In this manner, a plurality of liquid crystal cells 100 having the above configuration can be formed.

FIG. 4 is a schematic plan view illustrating the laser-annealing process in a conventional production method of a motherboard. The configurations of the laser 305 and the first motherboard 301 on which a silicon thin film is deposited are the same as those illustrated in FIG. 3(a). The laser 305 moves in a direction of an arrow A to polycrystallize a silicon thin film in the same manner as in FIG. 3(a). Here, in each of the laser irradiation regions R1 to R3, the entire surfaces of the transistor forming region 303 and the terminal region 304 are laser-annealed to be polycrystallized with regard to all the panel substrates 302. Although the laser joint region RG is formed between the two adjacent laser irradiation regions, the terminal region 304 as a marginal region of the conventional panel substrate 302 is not included in the laser joint region RG, which is different from the panel substrate 302 of the present invention.

As clearly seen from a comparison between FIG. 3(a) and FIG. 4, in the adjacent two laser irradiation regions, the space D1 between two lines of the panel substrates 302 of the present invention is narrower than a space D2 between two lines of the conventional panel substrates 302. Thus, by narrowing the space between two lines of the panel substrates 302 arranged over the adjacent two laser irradiation regions, more panel substrates 302 may be arranged on the first motherboard 301 illustrated in FIG. 3(a), compared to the case of the first motherboard 301 illustrated in FIG. 4.

Thus, in the present invention, it is possible to increase the number of the panel substrates 302 which can be manufactured from one first motherboard 301 without any inconvenience in production control. Therefore, the manufacturing cost can be reduced.

In the above explanation, only the marginal regions (terminal regions 304b) of the panel substrates 302b arranged in the second line in each of the laser irradiation regions R1 to R4 were included in the laser joint region RG. However, the present invention is not limited to this, and at least one marginal region (terminal region 304b) should be included in the laser joint region RG. Or alternatively, all the marginal regions (terminal region 304b) may be included in the laser joint region RG.

In the above-mentioned explanation, the terminal regions 304b as marginal regions were not laser-annealed. However, laser-annealing may be carried out twice to make the degree of crystallization of the silicon thin film in the terminal regions 304b become higher than that of the silicon thin film in the transistor forming region 303b. Or alternatively, the terminal regions 304b may be partially laser-annealed.

Depending on the kind of the laser 305, the laser intensity may not be constant from one end to the other end of the laser 305. FIG. 3(d) is a schematic view of a panel substrate and a graph showing distribution of laser intensity. For example, when the laser 305 which has variation in laser intensity as shown in the graph is used, a part S of the laser 305 in which laser intensity is lower may be set to irradiate the terminal region 304b as a marginal region, and a part F of the laser 305 in which laser intensity is stable may be set to irradiate the transistor forming region 303b. Thereby, effective use of the region irradiated by the laser 305 is achieved in addition to the increase in the degree of crystallization in the transistor forming region 303b. Here, it is also possible to irradiate the terminal region 304b twice by the part S of the laser 305 in which laser intensity is lower.

In the above explanation, the first motherboard 301 is fixed and the laser 305 moves along the direction of a column (the direction of arrow A) of the arranged panel substrates 302 to perform laser-annealing. However, the present invention is not limited to this, provided that the first motherboard 301 and the laser 305 should just move relatively to each other. Accordingly, the first motherboard 301 may be moved, while the laser 305 is fixed. Or alternatively, laser-annealing may be performed, while both the first motherboard 301 and the laser 305 are moved.

In the above explanation, the process for carrying out laser-annealing with use of one laser 305 has been described. However, the present invention is not limited to this, and a plurality of lasers may be used. Further, a plurality of lasers having various laser lengths may be used in combination to perform laser-annealing.

In the above explanation, the panel substrate 302 having a three-side-free structure is used, which has the transistor forming region 303 including a rectangular display region and the terminal region 304 formed on one side in the outer edge of the panel substrate 302. However, the present invention is not limited to this and is also applicable to the panel substrate which has a two-side-free structure or a one-side-free structure.

In the above explanation, the terminal region has been explained as the marginal region. However, in the present invention, the marginal region may also be a frame region where a monolithic circuit is not present, or alternatively, the marginal region may refer to both of them. Examples of a frame region where a monolithic circuit is not present as the marginal region may include a case illustrated in FIG. 3(e).

Namely, the laser irradiation regions R1 and R3 are the same as those illustrated in FIG. 3(a) and a part of the transistor forming region 303 of the panel substrate 302 are included in the laser joint region RG in each of the laser irradiation region R2 and R4.

In the above explanation, a case where a plurality of panel substrates 302 are arranged on the first motherboard 301 has been explained. However, the present invention is not limited to this. For example, when producing a liquid crystal display and the like which have a large panel substrate, one panel substrate may be arranged on the first motherboard. Then, the above method may be applied to produce a panel substrate of the present invention in which the crystal profiles of a transistor forming region and of a marginal region are different from each other.

In the above explanation, a panel substrate is cut out to form a display cell after the first motherboard and the second motherboard are bonded to each other. However, the present invention is not limited to this, and a panel substrate may be cut out directly from the first motherboard.

In the above explanation, the liquid crystal cell which is a typical display cell used in a flat panel display has been explained. However, the present invention is not limited to this, and it may be changed within the range which does not deviate from the scope of the present invention. For example, it is also applicable to the display cell used in an EL display, a flat panel detector and the like.

EFFECT OF THE INVENTION

According to the present invention, use of at least a part of terminal region in a panel substrate as a laser joint region allows efficient arrangement of panel substrates on a motherboard and reduction in a wasted substrate region.

BEST MODE FOR CARRYING OUT THE INVENTION

The present invention is more specifically described with reference to an embodiment. However, the present invention is not limited only to the embodiment.

Embodiment 1

Figure 1:
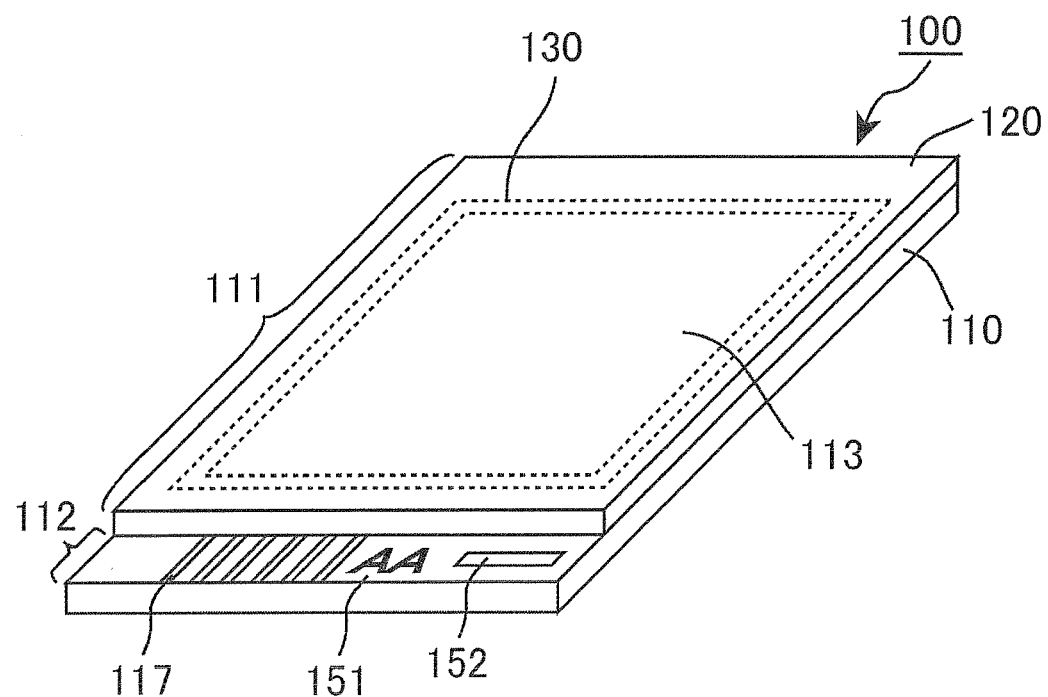
FIG. 1 is a perspective view illustrating a configuration of a liquid crystal cell including a device substrate obtainable in the present invention.
Figure 2:
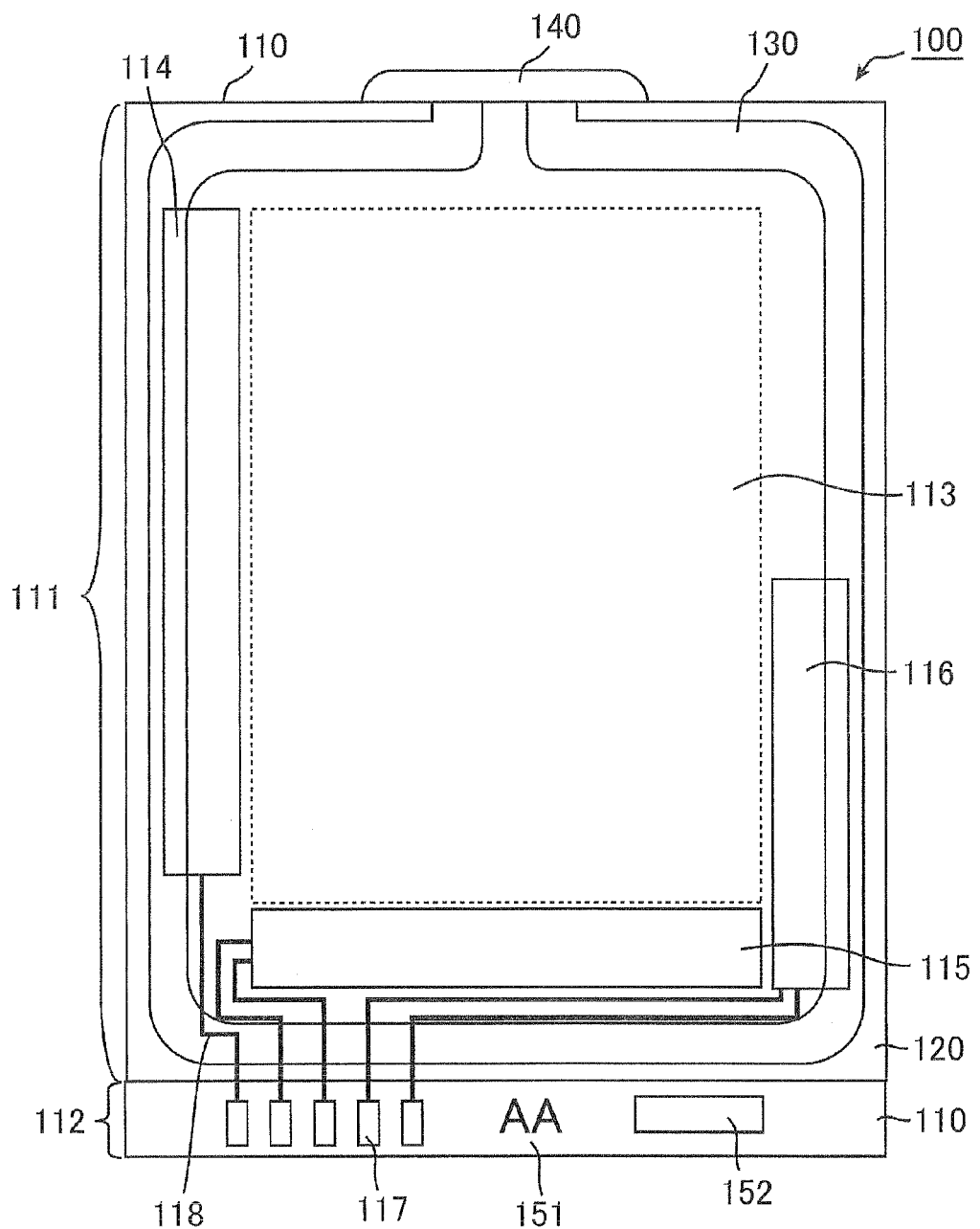
FIG. 2 is a plan view of the liquid crystal cell illustrated in FIG. 1.
Figure 3:
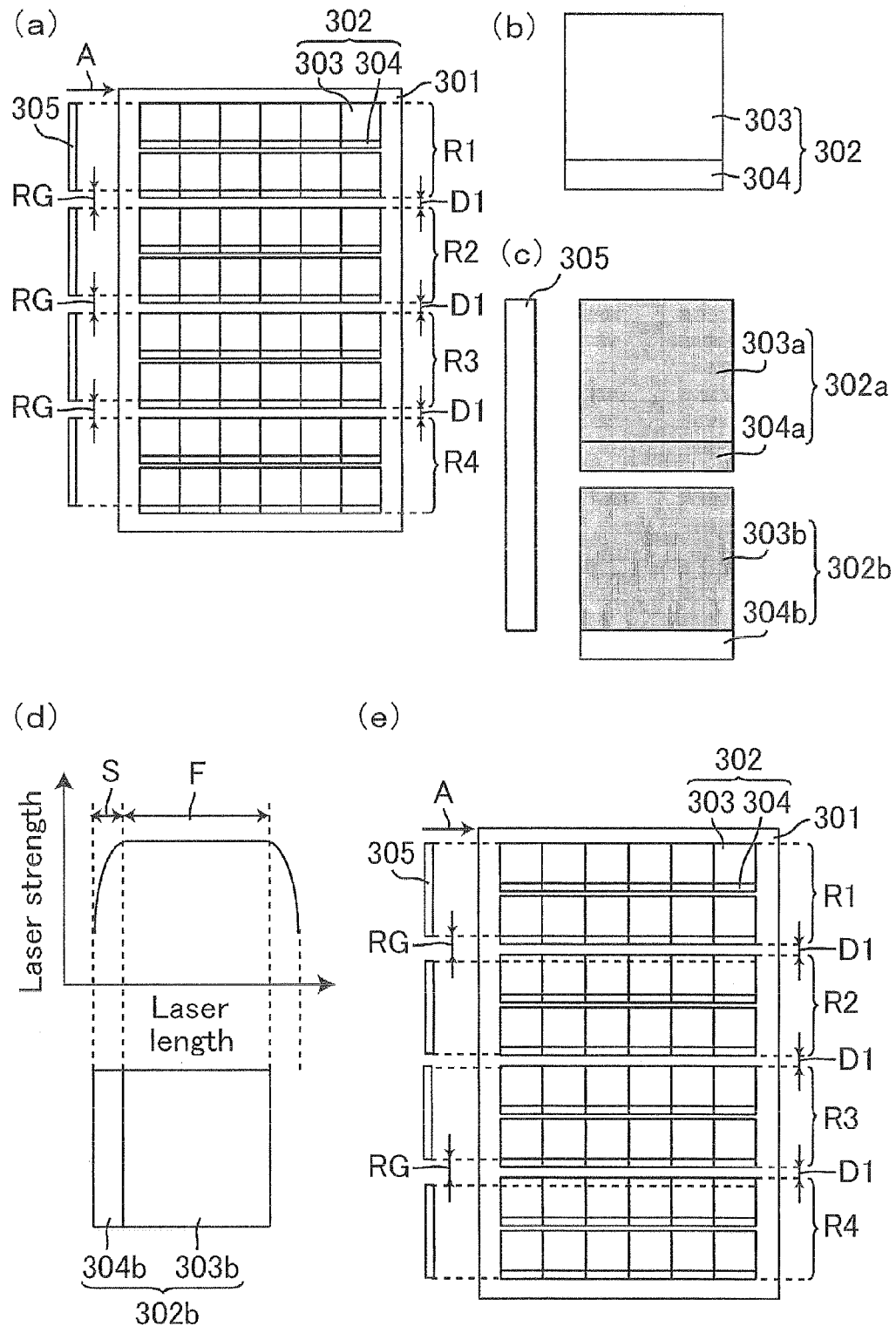
FIGS. 3(a) and (c) are schematic plan views for explaining the first motherboard in the present invention and a production method thereof.
FIG. 3(b) is a schematic plan view of a panel substrate.
FIG. 3(d) is a schematic view illustrating distribution of laser intensity on the panel substrate.
FIG. 3(e) is a schematic plan view for explaining another example of laser irradiation that is different from FIG. 3(a).
Figure 4:
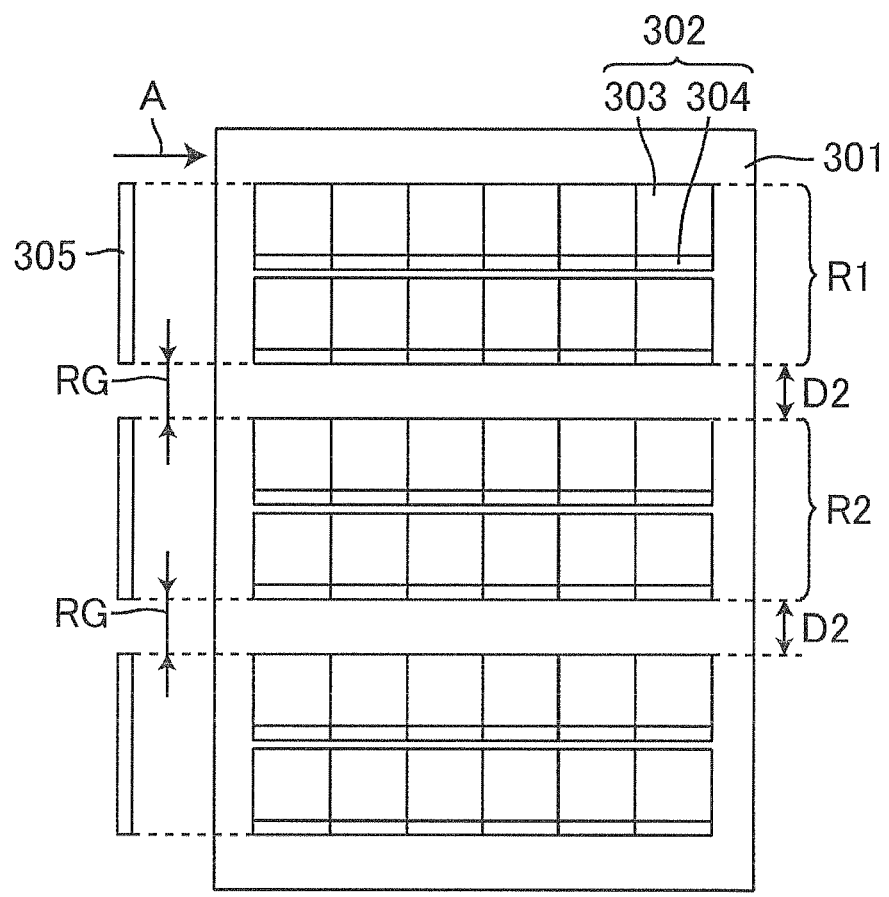
FIG. 4 is a schematic plan view for explaining a conventional first motherboard and a production method thereof.
Figure 5:
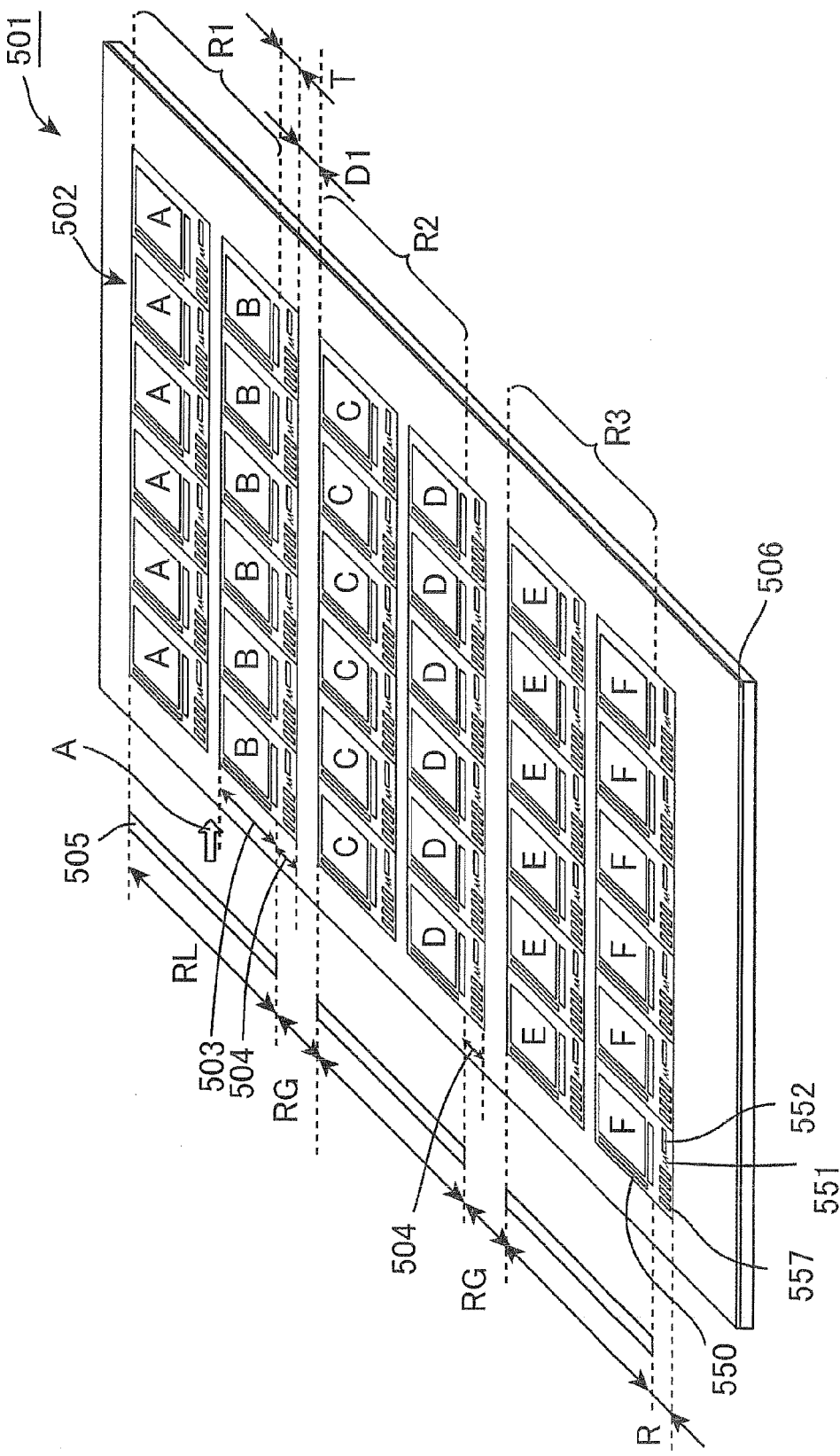
FIG. 5 is a perspective view for explaining the crystallization treatment of the silicon thin film on the motherboard in Embodiment 1.

In Embodiment 1, the process of carrying out laser-annealing of the first motherboard is explained. FIG. 5 is a perspective view illustrating the configuration of a first motherboard 501 having a plurality of panel substrates 502 in Embodiment 1. FIG. 5 schematically illustrates positions of circuits 550 and terminals 557 in panel substrates 502, which are patterned through various treatments carried out after the crystallization of the silicon thin film by laser-annealing. At the stage where the silicon thin film on the first motherboard 501 is annealed, the circuits 550 such as a gate driver circuit are not practically patterned yet. Therefore, the panel substrates 502 on the first motherboard 501 schematically shows assumed positions of circuits to be patterned through various treatments carried out after the crystallization.

In FIG. 5, the laser 505 is excimer laser and has a laser length of RL. The first motherboard 501 is a glass substrate having a thickness of about 0.7 mm. A silicon thin film 506 is deposited on the principal surface of the first motherboard 501, and the panel substrates 502 are arranged in a matrix pattern at predetermined intervals. Specifically, 36 pieces of panel substrates 502 are arranged in 6×6 matrix.

In the crystallization treatment of the silicon thin film 506 deposited on the first motherboard 501, the laser 505 moves in the direction of an arrow A and performs scanning of the principal surface of the first motherboard 501 for a plurality of times while shifting its position for each time to scan all the lines. Here, scanning is performed three times to polycrystallize the silicon thin film 506. Specifically, first laser irradiation is performed to the silicon thin film 506 on the first motherboard 501. Subsequently, the second laser irradiation is performed so that the following relations are established with regard to the laser joint region RG formed between the first laser irradiation region R1 and the second laser irradiation region R2.

$$D1 < D2$$

$$RG = D2 \leq T + D1$$

T: terminal length of the panel substrate
D1: Space between the lines of the panel substrates arranged over the adjacent two laser irradiation regions in the present embodiment
D2: Space between the lines of the panel substrates arranged over the adjacent two laser irradiation regions in a comparative embodiment Commonly, each of T, D1, and D2 has a length of about several millimeters. The laser joint region RG may be made into a region unstably irradiated by laser, or a region not irradiated by laser.

The third laser irradiation is performed in the same manner. Namely, laser irradiation is performed so that the above relations are established with regard to the laser joint region RG formed between the second laser irradiation region R2 and the third laser irradiation region R3.

In addition, in the third laser irradiation region R3, a region R on the side of an end portion of the substrate is not a laser joint region. However, the region R as well as the end portion of the first motherboard 501 may be made into a region unstably irradiated by laser or a region not irradiated by laser.

Through the above laser annealing, proper polycrystallization is performed to the silicon thin film in a region in which pixels and a monolithic circuit are scheduled to be formed in each of the panel substrates 502 arranged in a matrix pattern on the first motherboard 501. Consequently, the silicon thin film of the panel substrates 502 show the first crystal profile.

However, when the attention is focused on the terminal regions 504 as the marginal regions, it is clear that the panel substrates 502 include both the panel substrates 502 (A, C, E) in which the silicon thin films of the terminal regions 504 are properly polycrystallized to give the first crystal profile and the panel substrates 502 (B, D, F) in which the silicon thin films of the terminal regions 504 are unstably polycrystallized to give the second crystal profile. In addition, when the terminal regions 504 of the panel substrates 502 (B, D, F) are not annealed, the silicon thin films deposited in the terminal regions 504 of these panel substrates 502 (B, D, F) become amorphous.

In other words, the silicon thin films in the terminal regions 504 of the panel substrates 502 included in the specific line (column) arranged on the first motherboard 501 in a matrix pattern may have small or various average crystal grain sizes. Further, the surface roughness thereof may be large. Further, they may remain amorphous. Therefore, the present invention characteristically uses the terminal regions 504 that are the marginal regions as the laser joint regions RG. Moreover, the frame region where a monolithic circuit is not present may also be used as a marginal region.

Thus, in the production method of the motherboard including the panel substrate of the present invention, the laser joint region RG between the n-th laser irradiation region and the (n+1)th laser irradiation region includes the marginal regions of the panel substrates 502, namely, the terminal regions 504. Here, the laser joint region RG between the n-th laser irradiation region and the (n+1)th laser irradiation region refers to, for example, the laser joint region RG between the first laser irradiation region R1 and the second laser irradiation region R2, and the laser joint region RG between the second laser irradiation region R2 and the third laser irradiation region R3. That is, the laser joint region RG is not only formed by the wasted substrate region, but also by the terminal regions 504 of the panel substrates 502. Therefore, the wasted substrate region needs not to be enlarged and the first motherboard 501 is not wasted. In a best case, the laser joint region RG is substantially formed only by the terminal regions 504, and the wasted substrate region between the two panel substrates 502 is not needed, except for the wasted substrate region as a short-ring forming region.

The third laser irradiation region R3 does not include the region R on the side of the end portion of the substrate corresponding to the terminal regions 504 of the panel substrates 502 arranged in the sixth line on the first motherboard 501. Accordingly, the number of lines (columns) of the panel substrates 502 which can be annealed in one laser irradiation is not decreased, even when the range of one laser irradiation (laser length RL) is small. In other words, the maximum laser length of RL may be regarded to be practically (RL+T). Thereby, although it depends on the size of the panel substrate 502, the number of lines (columns) of the panel substrates 502 which can be irradiated in one laser irradiation may be increased within the range of this laser length (RL+T) in a best case.

In a best case, such a configuration allows efficient crystallization without increasing the number of times of the laser irradiation, while the number of the panel substrates 502 that can be arranged on the first motherboard 501 is increased. As a result, the effect of lowering a manufacturing can be obtained.

As above described, in the present invention, laser irradiation is performed unstably or not performed to the marginal region of the panel substrates 502 (B, D, E) arranged in the predetermined line or column on the first motherboard 501, namely, the silicon thin films of the terminal regions 504. Then, the uneven polycrystalline silicon thin film or amorphous silicon thin film is patterned so as to form a part of the manufacturing process control mark 551 or the TEG 552. The manufacturing process control mark 551 and the TEG 552 are formed in every panel substrate 502 on the first motherboard 501.

The first motherboard 501 in the present embodiment includes (1) the panel substrates 502 (A, C, E) having uniformly-polycrystallized silicon thin films that partially form the manufacturing process control marks 551 and the TEGs 552 arranged in the terminal regions 504, and (2) the panel substrates 502 (B, D, F) having nonuniformly-polycrystallized or amorphous silicon thin films that partially form the manufacturing process control marks 551 and the TEGs 552 arranged in the terminal regions 504.

It is to be noted that the TEGs 552 (B, D, F) comprising the thin film transistors made of unfavorably-polycrystallized silicon thin films are actually not appropriate for measurement, though they are apparently patterned appropriately. Here, a plurality of other panel substrates 502 are arranged on the first motherboard 501. The silicon thin films constituting the TEGs 552 (A, C, E) in these other panel substrates 502 are favorably polycrystallized. Therefore, the evaluation or the control of the device can be made by evaluating these TEGs 552 (A, C, E).

Comparative Embodiment

Figure 6:
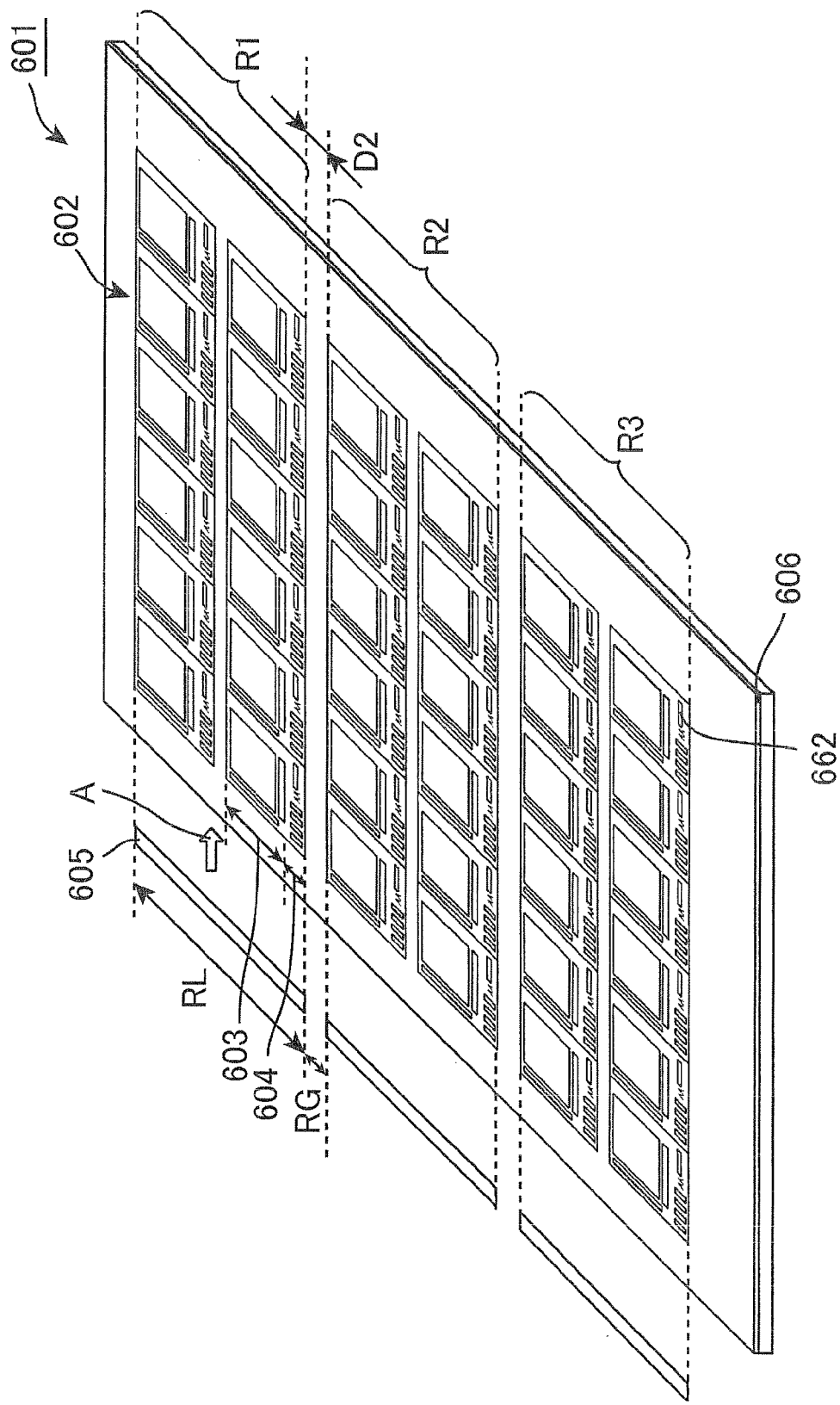
FIG. 6 is a perspective view for explaining the crystallization treatment of the silicon thin film on the motherboard in a comparative embodiment.

FIG. 6 is a schematic plan view illustrating laser annealing process in the production method of a conventional motherboard. The configurations of a laser 605 and a first motherboard 601 on which a silicon thin film 606 are deposited are the same as those illustrated in FIG. 5.

In the comparative embodiment, when the laser 605 scans the film surface of the first motherboard 601 for a plurality of times, all the panel substrates 602 arranged on the first motherboard 601 are equally laser-annealed.

More specifically, the laser 605 moves in the direction of an arrow A and performs scanning of the principal surface of the first motherboard 601 for a plurality of times while shifting its position to scan all the lines. Here, scanning is performed three times to polycrystallize the silicon thin film 606, while the first motherboard 601 is fixed and the laser 605 moves in the direction of the arrow A. The laser joint region RG is formed between each two adjacent laser irradiation regions out of the laser irradiation regions R1 to R3. The entire surface of transistor forming regions 661 and terminal regions 604 which constitute all the panel substrates 602 in each of the laser irradiation regions R1 to R3 are polycrystallized.

As mentioned above, conventionally, the laser irradiation width (laser length) RL has been required to exceed the length of the transistor forming region 603 and the terminal region 604 of the panel substrate 602, namely, the length of the entire panel substrate 602.

As clearly seen from the comparison between FIGS. 5 and 6, in the first motherboard 501 of the present invention, the space between two lines of the panel substrates arranged over the adjacent two laser irradiation regions is narrower than that of the conventional first motherboard 601. Accordingly, it is clear that the wasted substrate region is reduced and the panel substrates 502 are efficiently arranged on the first motherboard 501 in the present invention. Moreover, because of the shortened distance between the lines of the panel substrates on the first motherboard 501, it is possible to arrange panel substrates in the central part of the first motherboard 501, avoiding the peripheral part of the first motherboard 501 (outer edge of the first motherboard 501) in which a defect is likely to generate. Therefore, even in a case where the number of the panel substrates which can be arranged on the first motherboard 501 is not increased, the avoidance of the peripheral part of the first motherboard 501 in which a defect is likely to generate leads to an effect of improving the production yield rate of the panel substrates.

The present application claims priority to Patent Application No. 2008-239167 filed in Japan on Sep. 18, 2008 under the Paris Convention and provisions of national law in a designated State, the entire contents of which are hereby incorporated by reference.

EXPLANATION OF REFERENCES

100 Liquid crystal cell
110 Device substrate
111, 303, 303a, 303b, 503, 603 Transistor forming region
112, 304, 304a, 304b, 504, 604 Terminal region
113 Display region
114 Gate driver circuit
115 Source driver circuit
116, 550 Circuit
117, 557 Terminal
118 Wiring
120 CF substrate
130 Sealing material
140 Sealing resin
151, 551 Manufacturing process control mark
152, 552 TEG
301, 501 First motherboard
302, 302a, 302b, 502, 602 Panel substrate
305, 505, 605 Laser
506, 606 Silicon thin film
R1 to R4 Laser irradiation region
RG Laser joint region
RL Laser length

The invention claimed is:

1. A motherboard comprising a plurality of panel substrates, wherein the motherboard has a silicon thin film formed on a principal surface thereof,
   each of the panel substrates has a transistor forming region and a marginal region,
   the transistor forming region is formed by polycrystallizing the silicon thin film,
   the marginal region is provided on an outer edge of each of the panel substrates,
   a terminal region is provided in the marginal region and
   at least one of the panel substrates has the terminal region including a region with a silicon thin film which has a crystal profile different from a crystal profile of a silicon thin film in the transistor forming region.

2. The motherboard according to claim 1, wherein the panel substrates are arranged in a matrix pattern so that the marginal regions orient in the same direction, and include a first panel substrate and a second panel substrate,
   the first panel substrate having the marginal region with a silicon thin film which has a first crystal profile, and the second panel substrate having the marginal region with a silicon thin film which has a second crystal profile that is different from the first crystal profile.

3. The motherboard according to claim 2, wherein the crystal profile of the silicon thin film in the transistor forming region is the same as the first crystal profile.

4. The motherboard according to claim 1, wherein the transistor forming region includes a monolithic circuit comprising the silicon thin film.

5. The motherboard according to claim 1, wherein the silicon thin film forms a manufacturing process control mark and/or an evaluation pattern in the marginal region.

6. The motherboard according to claim 5, wherein the manufacturing process control mark and/or the evaluation pattern include a manufacturing process control mark and/or an evaluation pattern which include the silicon thin film having the first crystal profile and a manufacturing process control mark and/or an evaluation pattern which include the silicon thin film having the second crystal profile.

7. The motherboard according to claim 1, wherein the crystal profile of the silicon thin film in the transistor forming region and the crystal profile of the silicon thin film in the marginal region are different in at least one property selected from average crystal grain size, crystal grain size distribution, and surface roughness of crystals.

8. The motherboard according to claim 2, wherein the first crystal profile and the second crystal profile are different in at least one property selected from average crystal grain size, crystal grain size distribution, and surface roughness of crystals.

9. The motherboard according to claim 2, wherein the first crystal profile is polycrystalline, and the second crystal profile is unstable-crystalline and/or amorphous.

10. The motherboard according to claim 1, wherein each of the panel substrates has a transistor forming region including a rectangular display region, and a marginal region formed on one side of the outer edge of the panel substrate.

11. A method of producing a motherboard comprising a plurality of panel substrates each having a transistor forming region and a marginal region, the method comprising:
   depositing a silicon thin film on a principal surface of a motherboard;
   and
   laser-annealing the silicon thin film for each predetermined region,
   wherein laser-annealing is carried out so as to form a transistor forming region by moving a laser and the motherboard relatively to polycrystallize the silicon thin film in a predetermined region, and to form a region with a silicon thin film in at least one marginal region, the marginal region being provided on an outer edge of each of the panel substrates and a terminal region being provided in the marginal region, and
   wherein the terminal region of at least one of the panel substrates includes a region with a silicon thin film having a crystal profile different from a crystal profile of a silicon thin film that forms the transistor forming region.

12. The production method of a motherboard according to claim 11, wherein the step of laser-annealing includes relatively moving the motherboard and the laser along a direction of a line or a column so that the panel substrates are arranged in a matrix pattern on the principal surface of the motherboard, and
   laser-annealing the panel substrates so that the panel substrates include a first panel substrate having a marginal region with a silicon thin film that has a first crystal profile and a second panel substrate having a marginal region with a silicon thin film that has a second crystal profile different from the first crystal profile.

13. The production method of a motherboard according to claim 12, wherein the step of laser-annealing is carried out so that the crystal profile of the silicon thin film in the transistor forming region is the same as the first crystal profile.

14. The production method of a motherboard according to claim 11, further comprising the step of patterning the silicon thin film in the marginal region to form a manufacturing process control mark and/or an evaluation pattern.

15. The production method of a motherboard according to claim 14, wherein the silicon thin film to be patterned is an unstably-crystallized silicon thin film and/or an amorphous silicon thin film.

16. The production method of a motherboard according to claim 11, wherein the laser is excimer laser.

17. A device substrate comprising a transistor forming region and a marginal region, wherein the transistor forming region is formed by polycrystallizing a silicon thin film,
- the marginal region is provided on an outer edge of the device substrate, and
- the marginal region includes a region with a silicon thin film which has a crystal profile different from a crystal profile of the silicon thin film forming the transistor forming region.

18. The device substrate according to claim 17, wherein an unstable-crystallized silicon thin film or an amorphous silicon thin film forms a manufacturing process control mark and/or an evaluation pattern in the marginal region.

* * * * *